US010401390B2

(12) United States Patent
Frackelton et al.

(10) Patent No.: US 10,401,390 B2
(45) Date of Patent: Sep. 3, 2019

(54) FORMATTING AND NAVIGATING GRAPHED INFORMATION

(71) Applicant: Keithley Instruments, Inc., Cleveland, OH (US)

(72) Inventors: Brian P. Frackelton, Macedonia, OH (US); George J. Polly, Brecksville, OH (US)

(73) Assignee: Keithley Instruments, LLC, Solon, OH (US)

( * ) Notice: Subject to any disclaimer, the term of this patent is extended or adjusted under 35 U.S.C. 154(b) by 655 days.

(21) Appl. No.: 14/701,109

(22) Filed: Apr. 30, 2015

(65) Prior Publication Data

US 2016/0146855 A1 May 26, 2016

Related U.S. Application Data

(60) Provisional application No. 62/082,306, filed on Nov. 20, 2014.

(51) Int. Cl.
*G01R 13/02* (2006.01)
*G01R 13/00* (2006.01)
(Continued)

(52) U.S. Cl.
CPC ............ *G01R 13/02* (2013.01); *G01R 13/00* (2013.01); *G01R 13/40* (2013.01);
(Continued)

(58) Field of Classification Search
CPC ...................................................... G01R 13/02
(Continued)

(56) References Cited

U.S. PATENT DOCUMENTS

| 2006/0109271 A1* | 5/2006 | Lomask | ................ | G06T 11/206 |
| | | | | 345/440 |
| 2008/0255784 A1* | 10/2008 | Gamper | ............. | G01R 13/0245 |
| | | | | 702/67 |

(Continued)

FOREIGN PATENT DOCUMENTS

| JP | 2014153313 A | 8/2014 |
| JP | 2014153315 A | 8/2014 |
| JP | 2014159980 A | 9/2014 |

OTHER PUBLICATIONS

European Search Report and Written Opinion for European Patent Application No. 15195660.4, dated Apr. 20, 2016, 10 pages.

(Continued)

*Primary Examiner* — Ly D Pham
(74) *Attorney, Agent, or Firm* — Miller Nash Graham & Dunn; Andrew J. Harrington

(57) ABSTRACT

A method in an electronic device that may include determining, with a processor, a quantity of group markers in a data set, and determining, with the processor and based on the quantity of group markers, a suggested view from a plurality of available views, each view in the plurality of available views diagrammatically depicting at least a portion of the data set. Also, a processor-implemented method of navigating between portions of a data set may include displaying, on a touchscreen display, a diagrammatical depiction of a first portion of the data set; detecting a continuous arc gesture at the touchscreen display; determining a direction of the arc gesture; selecting a second portion of the data set based on the determined direction of the arc gesture; and displaying a diagrammatical depiction of the second portion of the data set.

12 Claims, 9 Drawing Sheets

(51) Int. Cl.
    *G06F 3/0488* (2013.01)
    *G01R 31/319* (2006.01)
    *G01R 13/40* (2006.01)
    *G01R 31/3177* (2006.01)
    *G06F 3/01* (2006.01)

(52) U.S. Cl.
    CPC ... *G01R 31/3177* (2013.01); *G01R 31/31912* (2013.01); *G01R 31/31914* (2013.01); *G06F 3/017* (2013.01); *G06F 3/04883* (2013.01); *G01R 13/0236* (2013.01); *G06F 2203/04104* (2013.01)

(58) Field of Classification Search
    USPC .......................................................... 702/67
    See application file for complete search history.

(56) References Cited

U.S. PATENT DOCUMENTS

| | | |
|---|---|---|
| 2010/0245389 A1 | 9/2010 | Kazunori |
| 2014/0100955 A1* | 4/2014 | Osotio .................... G06F 3/011 |
| | | 705/14.55 |

OTHER PUBLICATIONS

8 Gesture Icon Sets for Designing Multi-Touch Interfaces, The Designing Inspiration, published Oct. 23, 2012, found at: http://thedesigninspiration.com/articles/8-gesture-icon-sets-for-designing-multi-touch-interfaces/ printed Apr. 30, 2015.

* cited by examiner

Hop to Prior Group

Hop to Next Group

FORMATTING AND NAVIGATING GRAPHED INFORMATION

CROSS-REFERENCES TO RELATED APPLICATIONS

This patent application claims priority to and the benefit of U.S. provisional application No. 62/082,306, filed Nov. 20, 2014, which is incorporated in this patent application by this reference.

FIELD OF THE INVENTION

This disclosure is directed to devices and methods for manipulating graphed information, particularly within a digital multimeter.

BACKGROUND

Historically, there have been two widely used forms of electronic test equipment: an oscilloscope and a multimeter. Conventional oscilloscopes generally plot voltage as a function of time, usually by way of a continuous graph, where the voltage results from a signal input to the oscilloscope. The user can then measure various features of the waveform, including its amplitude and frequency. Accordingly, a conventional oscilloscope (or "scope") acquires a snapshot of data and immediately displays it. Conventional oscilloscopes support manual scaling by allowing the user to set the scale with dials. Some graphing packages or software for conventional oscilloscopes offer autoscale software options. But the manual scaling and the graphic software of conventional oscilloscopes focus on the y-axis. Since the x-axis is programmed by the user to determine the sampling rate and interval, there isn't a need to automatically scale the x-axis in a conventional oscilloscope.

By contrast, a conventional multimeter generally combines several measurement functions in one unit, often acting as a voltmeter, ammeter, and ohmmeter, among other functions. Conventional digital multimeters, or DMMs, sometimes include a graphic representation of the quantity under test. Some benchtop versions of conventional DMMs also record data over time through a data logging functionality. But a conventional multimeter does not behave like a scope when it samples at high rates or in bursts.

Embodiments of the invention address the shortcomings with the conventional systems.

SUMMARY OF THE DISCLOSURE

The present application is directed to methods and apparatus for formatting and navigating graphed information. Embodiments of the invention may be particularly useful in digital multimeters having graphical displays, in which both oscilloscope data and benchtop, data logging data may be displayed. In such a device, data is generally graphed on a display for presentation to a user.

Embodiments are able to look at acquired data and use the number of group markers to determine how to scale the graph. The available information can be utilized to intelligently select scaling parameters for the user given previously, or concurrently, acquired data sets.

Embodiments of the invention automatically determine a subset of the data to graph based upon minimalistic information stored with the data itself. Put another way, some embodiments determine a scale and position in the x-axis or the y-axis, or both, that is appropriate in view of a particular data set. Thus, some embodiments do not require knowledge about how the data was acquired, only the location and number of group markers. This may reduce storage requirements in embodiments. It also may allow graphing to work equivalently with both real time and historical data sets.

Embodiments of the invention also allow for navigation between portions of a data set, such as by hopping forward or backward within a data set. This navigation can be initiated by the user through an arc gesture input on a touchscreen display.

Thus, at least some aspects of a method in an electronic device having a graphical display may include determining, with a processor, a quantity of group markers in a data set and determining, with the processor and based on the quantity of group markers, a suggested view from a plurality of available views, each view in the plurality of available views diagrammatically depicting at least a portion of the data set.

In other aspects, a processor-implemented method of navigating between portions of a data set may include displaying, on a touchscreen display, a diagrammatical depiction of a first portion of the data set; detecting a touch input at the touchscreen display, the touch input comprising a continuous arc gesture with a start point and an end point; determining a direction of the arc gesture by detecting whether the end point is to a first side or to a second side of the start point; selecting a second portion of the data set based on the determined direction of the arc gesture; and displaying, on the touchscreen display, a diagrammatical depiction of the second portion of the data set. In some versions, the first portion can be less than a whole of the data set, the second portion can be less than the whole of the data set, and the second portion need not overlap the first portion.

In still other aspects, a non-transitory computer-readable medium have computer-executable instructions stored thereon which, in response to execution by a computing device, cause the computing device to perform operations. Those operations may include determining a quantity of group markers in a data set and determining, based on the quantity of group markers, a suggested view from a plurality of available views, each view in the plurality of available views diagrammatically depicting at least a portion of the data set.

These and other features, aspects, and advantages of the disclosed subject matter will become better understood with reference to the following description, appended claims, and accompanying drawings of embodiments of the invention.

DETAILED DESCRIPTION

As described herein, embodiments of the invention are directed to methods and apparatus for formatting and navigating graphical information, particularly graphical representations of data. Some embodiments may be implemented in a digital multimeter having a full graphical display.

Figure 1A:
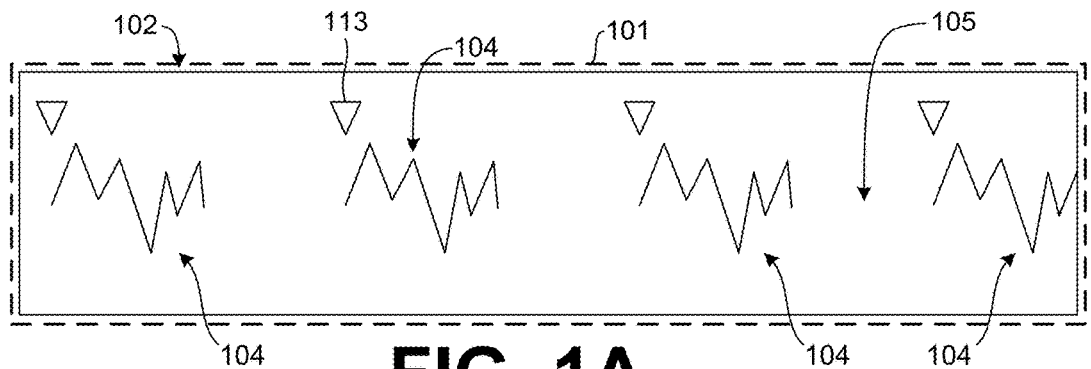
FIG. 1A is a graphical illustration of a "view all" mode.
Figure 1B:
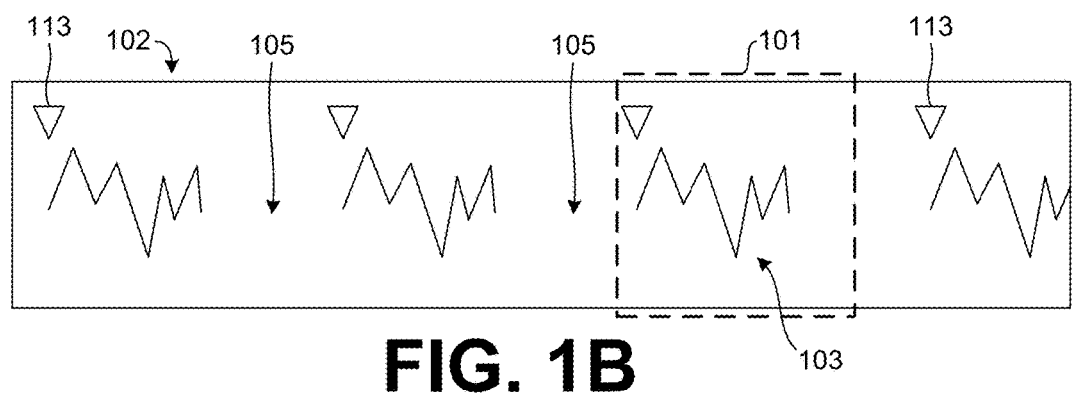
FIG. 1B is a graphical illustration of a "track group" mode.
Figure 1C:
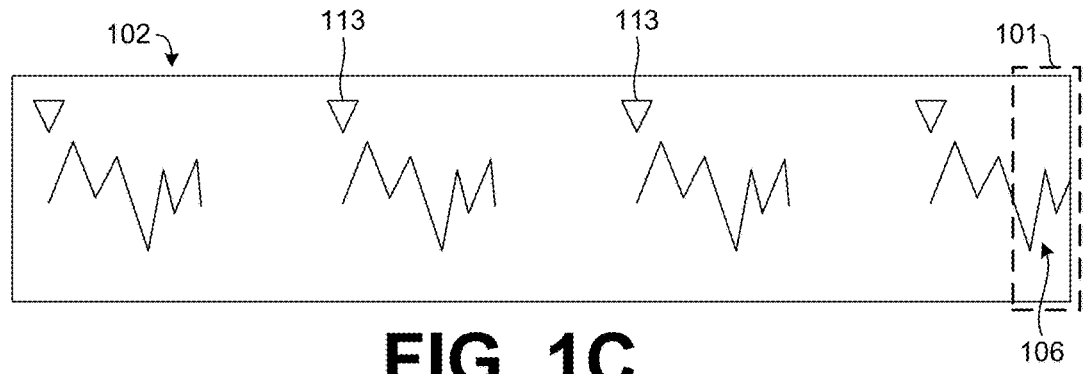
FIG. 1C is a graphical illustration of a "track latest" mode.

FIGS. 1A, 1B, and 1C are graphical illustrations of different x-axis scaling modes, according to embodiments. In each of the graphical illustrations, a dashed-line rectangle 101 indicates that portion of a data set 102 that would be viewable to a user for the depicted scaling mode. Consequently, the dashed-line rectangle 101 is for illustrative purposes, and would typically not be visible to the user on a graphical display. In each of FIGS. 1A, 1B, and 1C, the horizontal x-axis is the time axis, which increases from left to right. In other embodiments, the x-axis may represent a value other than time or the value may decrease from left to right. For example, the x-axis may be set to plot the data by index, in which the data points are equally spaced along the x-axis without regard to time. Each group of data in FIGS. 1A, 1B, and 1C is also shown with a group marker 113, which is explained in more detail below.

FIG. 1A is a graphical illustration of a "view all" mode, according to embodiments. In the view all mode, the x-scale is zoomed out to show the entire data set 102 at once. In FIG. 1A, the dashed-line rectangle 101 is around substantially the entire data set 102. Thus, the view all mode can be helpful if the entire data set 102 is of interest.

FIG. 1B is a graphical illustration of a "track group" mode, according to embodiments. In the track group mode, the x-scale is zoomed to a latest, or most recent, full burst 103 in its entirety. Accordingly, the dashed-line rectangle 101 in FIG. 1B is around the most recent full burst 103, and the data within the dashed-line rectangle 101 is that portion of the data set 102 that would be viewable to the user. The dashed-line rectangle is not around the rightmost data in FIG. 1B because that burst, which is shown as being in progress, is not yet completed, or full. Thus, the track group mode can be helpful if the data set 102 contains multiple bursts of measurements, and the user wants to focus on the most recently acquired group or burst. In other embodiments, the track group mode focuses on a group captured before the most recently acquired group.

In this context, a burst 104 is a cluster of measurements taken in relatively quick succession, often preceded and followed by idle time 105, in which no measurements are taken. When an instrument is configured to start a burst 104 at a particular time or after a particular interval of idle time, the burst, when initiated, is said to have been triggered.

FIG. 1C is a graphical illustration of a "track latest" mode, according to embodiments. In the track latest mode, the x-scale is zoomed to the latest, or most recent, portion 106 of the measurements. The latest portion 106 of measurements are those measurements currently being recorded. Accordingly, the dashed-line rectangle 101 in FIG. 1B is around that part of the current group that was most recently acquired, and the data within the dashed-line rectangle 101 is that portion of the data set 102 that would be viewable to the user. Thus, the track latest mode can be helpful if the data is consistent and homogenous, for example, where there are no data bursts in the data set.

Some embodiments can include a "track oldest" mode. In the track oldest mode, the x-scale may be zoomed to the oldest, or least recent, portion of the measurements in the data buffer. As an example, with reference to FIG. 1C, the track oldest mode could zoom to the left-most data in the graphical illustration. In some embodiments of the track oldest mode, the x-scale may be zoomed to the oldest, or least recent, full burst of measurements in the data buffer. As an example, with reference to FIG. 1C, the track oldest mode could zoom to the left-most full data burst, or group, in the graphical illustration. This can be referred to as the "track oldest group" mode.

Figure 2A:
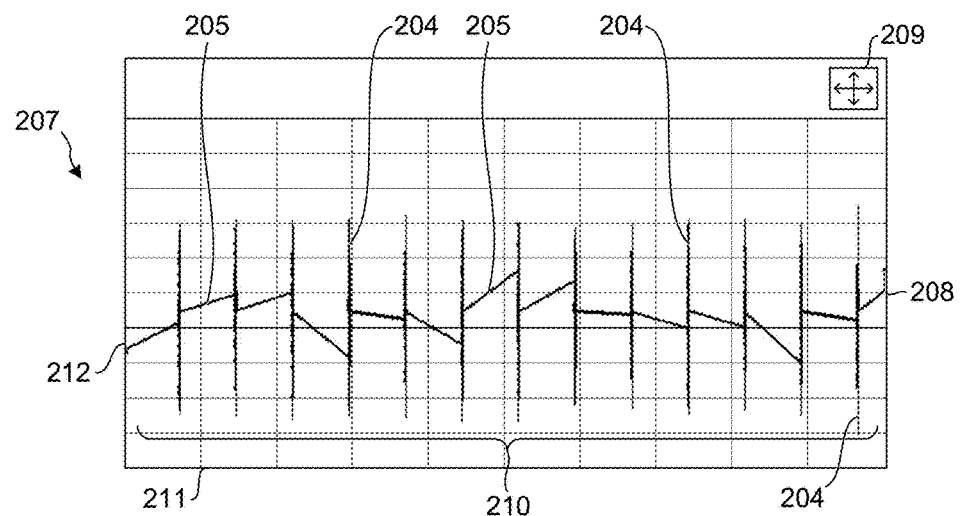
FIG. 2A is a representation of a graphical display depicting a view all mode.

FIG. 2A is a representation of a graphical display 207 depicting the view all mode, according to embodiments. The graphical display 207 may include a touchscreen display 208, and the graphical display 207 may include an icon 209, which is discussed in more detail below. FIG. 2A shows a series of measurement bursts 204 within a buffer 210, with delays, or idle time 205, between the bursts 204. In embodiments, the horizontal x-axis 211 could denote time in seconds or fractions of a second. In embodiments, the vertical y-axis 212 could denote voltage, current, resistance, or other measurements.

Since the entirety of the buffer is viewed and plotted in the view all mode, a portion of the data may be too small to see. For example, suppose an electronic device is configured to have a one-million measurement buffer and to acquire 100,000 readings at one million samples per second, thus taking 100 milliseconds to complete the samples. Further suppose that there is a 10-second idle time between triggering of measurement bursts. If this buffer is graphed and zoomed out to show the whole buffer in the view all mode, the graph would show small bursts of data with much empty space, due to the large time gaps relative to the burst durations, between the measurement bursts. In other words, it may look like FIG. 2A.

Figure 2B:
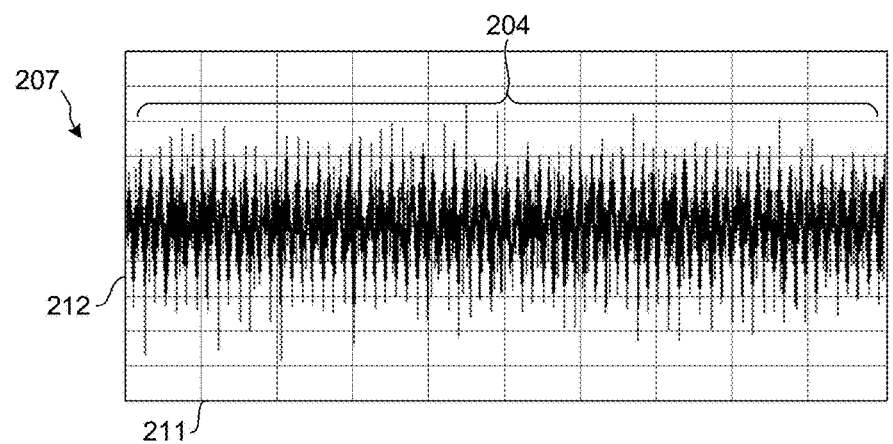
FIG. 2B is an enlargement of one group of data within the whole buffer shown in FIG. 2A.

FIG. 2B is an enlargement of one group of data within the whole buffer shown in FIG. 2A. For example, the enlarged group 204 of FIG. 2B may be the right-most group of FIG. 2A. In this view, which is a version of the track group mode discussed above, details of the data burst are more readily seen. The other data still exists in the buffer, but the view is zoomed in to show one group or subset of measurements within the whole data set.

For example, suppose an instrument is configured to have a one-million measurement buffer and to take 100,000 measurements at a sampling rate of 20,000 samples per second. Thus it takes about 5 seconds to complete a burst. If the x-scale is set by the user at 100 milliseconds, it will show the data in snapshots that do not show the entire span of the burst. Therefore, the track group mode may be an appropriate way to depict the data for analysis or presentation to the user.

As another example, suppose an instrument is configured to have a one-million measurement buffer and to take 20,000 samples per second continuously, that is, without any bursts or idle time. In this case, the track latest mode may yield the best results for a user because many users would typically want to track just the latest data under those sampling conditions. Alternatively, the track oldest mode may yield the best results for the user that wants to follow just the oldest data under the sampling conditions.

Figure 3:
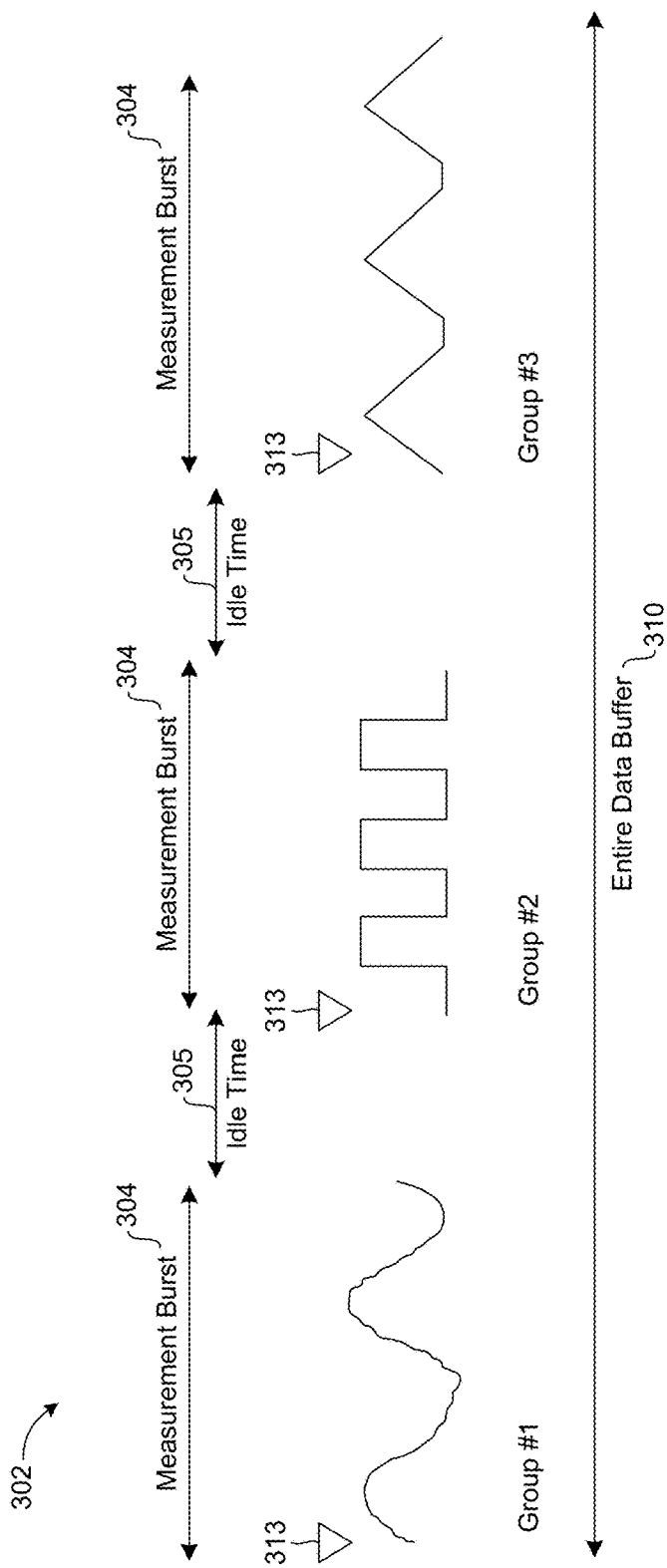
FIG. 3 is a graphical illustration of an example data set.

FIG. 3 is a graphical illustration of an example data set 302, according to embodiments. The figure shows an entire data buffer 310 of the data set 302. As indicated, the figure shows three groups labeled Group #1, Group #2, and Group #3, although embodiments could have fewer than three groups or more than three groups. Each group is a result of a different measurement burst 304, and the groups are separated by idle time 305 between the measurement bursts 304. During the idle time 305, no measurements are taken. In embodiments, the time scale generally progresses from left to right in the figures, so that the measurement burst that resulted in Group #1 was earlier in time than, or before, the measurement burst that resulted in Group #2. Likewise, the measurement burst that resulted in Group #3 was later in time than, or after, the measurement burst that resulted in Group #2.

Each group, that is Group #1, Group #2, and Group #3, is a diagrammatical depiction of data taken during the respective measurement burst or period. Depending on the underlying data, the diagrammatical depiction could take many forms. For example, Group #1 resembles a sine wave, Group #2 is a square wave, and Group #3 is a triangle wave. But other shapes are also possible.

Each group includes an indication of a group marker 313. In embodiments, such as shown in FIG. 3, the group marker 313 is a start of group marker, which occurs at the beginning of a group, but other data markers could also be used. For example, the group marker 313 could be an end of group marker, measurement count information, an end of a measurement gap indicator, an end of idle time indicator, or a timestamp stored for later correlation to measurement points. The group markers are discussed in more detail below.

Figure 4:
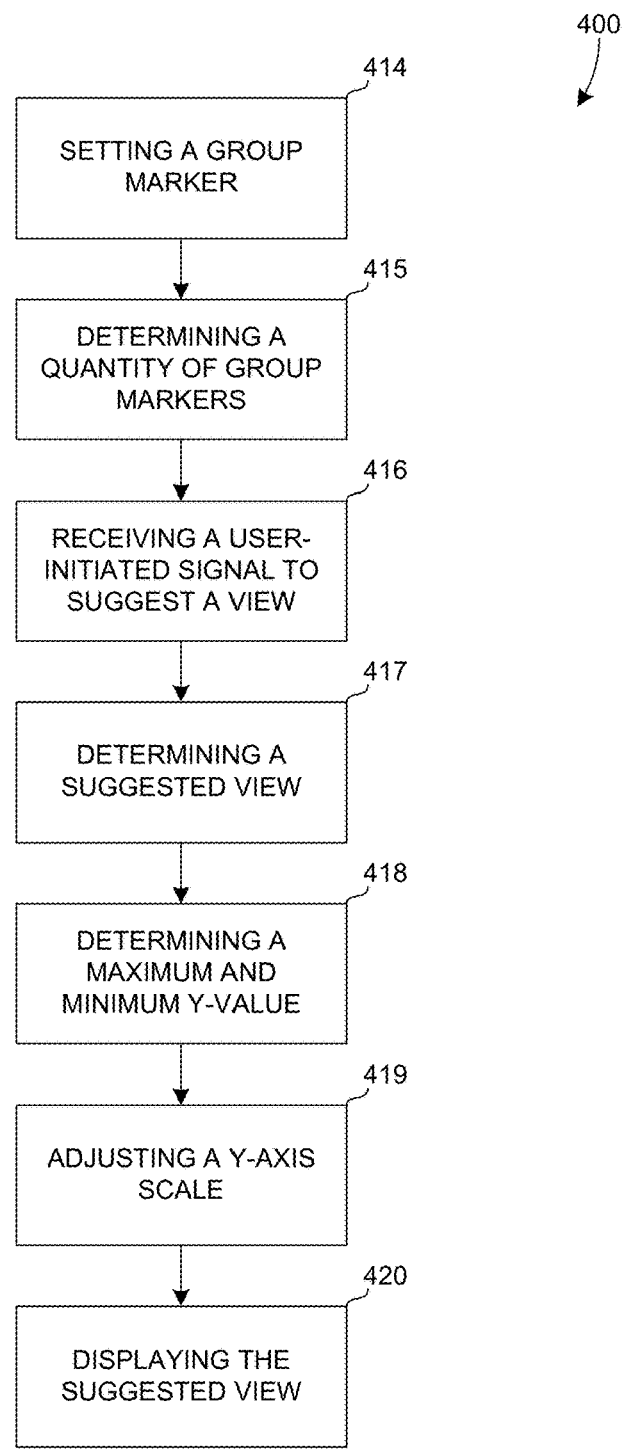
FIG. 4 is a flowchart of a method.

Hence, such as shown in FIG. 4, a method embodiment 400 may include setting a group marker 414, determining a quantity of group markers 415, receiving a user-initiated signal to request a suggested view 416, determining a suggested view 417, and displaying the suggested view 420. Not all of these operations are required in each embodiment of the method. Moreover, unless otherwise indicated, the operations need not be performed in the order shown in FIG. 4 for all embodiments.

In FIG. 4, setting a group marker 414 occurs before determining the quantity of group markers 415. Setting the group marker 414 can include setting the group marker at a first measurement point of a sequence of measurements, only if a total quantity of measurements in the sequence is finite and is greater than one. In embodiments, the total quantity of measurements can be determined by the data set or inferred from the configuration settings of the instrument. For example, the user may have configured the instrument, by setting a dial, entering a value, or otherwise programing the configuration, to take a specific number of measurements at a specific rate. Thus, the total quantity of measurements would be known. In some embodiments, setting the group marker can include setting the group marker at the first measurement point in real time, as the first measurement point is recorded or as the burst is triggered.

In embodiments, a processor determines the quantity of group markers in the data set. The processor may determine a suggested view of the data set based on the quantity of group markers in the data set. The suggested view is determined from a plurality of available views, and each view in the plurality of available views diagrammatically depicts at least a portion of the data set. The plurality of available views may include the view all mode, the track group mode, the track latest mode, and the track oldest mode, each as discussed above. In embodiments, the processor is within the electronic device and may be a microprocessor.

In some embodiments, when the quantity of group markers is zero, the suggested view is a diagrammatical depiction of a latest portion of the data set or an oldest portion of the data set. For example, the diagrammatical depiction may be the track latest mode. As another example, the diagrammatical depiction may be the track oldest mode. In some embodiments, when the quantity of group markers is greater than one, the suggested view is a diagrammatical depiction of a most-recent full-burst portion of the data set. For example, the diagrammatical depiction may be the track group mode. As another example, the diagrammatical depiction may be the track oldest group mode. In some embodiments, when the quantity of group markers is equal to one, the suggested view is a diagrammatical depiction of an entirety of the data set. For example, the diagrammatical depiction may be the view all mode.

In embodiments, the suggested view is displayed on the graphical display of the electronic device. In some embodiments, the suggested view is displayed on a touchscreen display. Preferably, the electronic device is a test and measurement instrument. More preferably, the electronic device is a digital multimeter.

In embodiments, the processor receives a user-initiated signal to request the suggested view. In some embodiments, the user-initiated signal results from a user selecting an icon on the touchscreen display, such as shown in FIGS. 2A and 2B.

In embodiments, the x-axis scale or the y-axis scale, or both, could be manually controlled. In embodiments, the manual control could be instead of or in addition to the automatic control.

In embodiments, the icon only appears on the touchscreen display when the suggested view is different from the displayed view. For example, in some embodiments a user may be able to manually select what portion of the data set to view. Suppose that, in such an embodiment, the user has chosen the view all mode. If, however, the suggested view includes the track group mode instead of the view all mode, the icon may appear on the touchscreen display. In embodiments, if the user then invokes the icon, the displayed view changes to be the suggested view. In other embodiments, the displayed view automatically changes to be the suggested view without the user invoking the change.

In some embodiments, the suggested view includes a diagrammatical depiction of a subset of the data set arranged on a horizontal x-axis and a vertical y-axis. In some of such embodiments, the method may also include determining a maximum y-value and a minimum y-value of the subset 418. And the method may also include adjusting a y-axis scale 419 such that the maximum y-value is substantially at an upper limit of the y-axis and the minimum y-value is substantially at a lower limit of the y-axis. In other embodiments, the method may also include adjusting a y-axis scale such that the y-values substantially occupy a predetermined percentage of the display screen. In embodiments showing multiple simultaneous waveforms, the y-axis of each waveform may be individually scaled to a particular percentage of the display screen, with the y-axis scale maximized for each waveform to use the space provided to it. In this context, maximized means that the waveform preferably occupies at least 60% of the particular percentage of the display screen, more preferably at least 75% of the particular percentage of the display screen, and even more preferably at least 90% of the particular percentage of the display screen.

In some embodiments, adjusting the y-axis scale includes utilizing the maximum y-value and the minimum y-value to determine which of a number of available zoom levels should be displayed. For example, rather than having infinitely variable zoom amounts, the y-axis scale may have two or more discrete zoom levels. As an example, the discrete zoom levels could be every ten percent, such that the zoom amounts are 120%, 110%, 100%, 90%, 80%, 70%, 60%, etc. Other intervals could also be used, including zoom amounts separated by 5%, 20%, or 25%, and the zoom amount could be greater than 120% or less than 60%. This feature could be useful in data exhibiting hysteresis, which may otherwise cause the y-axis to rapidly re-scale as the data shifts, possibly making it difficult for the user to view the data in real time.

In embodiments, the track group mode may also be configured to show multiple groups plotted on top of each other. In such embodiments, a primary group may be shown in a color of focus, such as yellow or red, and the other groups may be shown in a less emphasized color, such a blue, green, or purple. In embodiments, the other groups may be shown in increasingly less visible or less intense colors. For example, the relatively older groups may be less visible than the relatively more recent groups. In embodiments, the user may select which group has the primary focus. In embodiments, the instrument's buffer retains the entire data set, although only a portion of the data set might be displayed at a time.

Thus, embodiments of the invention intelligently and automatically scale between multiple x-axis modes or y-axis modes, or both, by looking at features of the data. Also, the methods and techniques described for the y-axis could be used for the x-axis, and vice versa.

In embodiments, automatic scaling of a histogram may also be performed. A histogram is a graphical representation of a continuous probability distribution of numerical data, where the range of values are divided into a series of intervals called bins. For each bin, the histogram includes a rectangle whose height is proportional to the number of values that fall into the interval and whose width is equal to the bin size. Accordingly, in embodiments a processor may review a data set and determine how to bin the data and how to display the bins on a graphical display. If the data shifts, that is, if the maximum or minimum values change over time, the processor may redefine the bins to capture all of the data. If the data does not shift over time, the processor may zoom out the displayed view to make all of the bins visible.

Additionally, it is sometimes useful to switch between groups of data while still allowing the pan and pinch-to-zoom functions that are typical for a conventional touch-screen display. For example, suppose that a user sets up a measurement test, runs the test three times, and collects three bursts of data. The data may be stored as three groups in the data buffer, for example, as shown in FIG. 3. Further, suppose that the user notices an anomaly in the measured data and zooms in to further inspect the data in the region of the anomaly. While positioned tightly, that is, zoomed in, on the anomaly, the user may wish to hop or jump back to a previous measurement burst or hop or jump forward to a subsequent measurement burst to see how it compares.

Figure 5A:
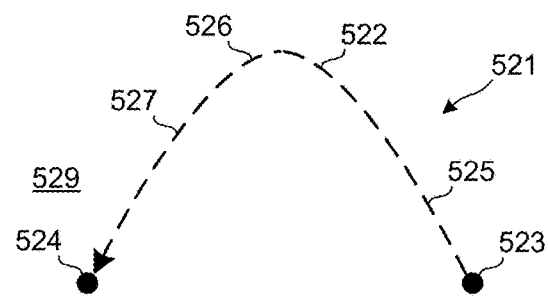
FIG. 5A represents a trace pattern of an arc gesture to the left.
Figure 5B:
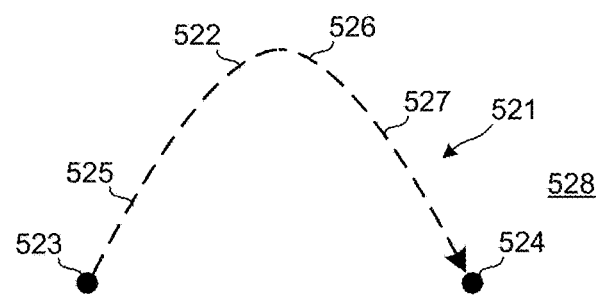
FIG. 5B represents a trace pattern of an arc gesture to the right.

FIG. 5A represents a trace pattern 521 of an arc gesture 522 to the left, according to embodiments. FIG. 5B represents a trace pattern 521 of an arc gesture 522 to the right, according to embodiments. For example, each of these is a pattern that the user may trace or draw with the user's finger or a stylus as a touch input on a touchscreen.

The touch input may be a continuous arc gesture 522 with a start point 523 and an end point 524. In this context, "continuous" means that the user, when making the arc gesture 522, does not lift the user's finger or stylus from the touchscreen between the start point 523 and the end point 524. To put this another way, continuous means that the processor does not detect a finger lift or a stylus lift between the start point 523 and the end point 524 of the arc gesture 522.

The arc gesture 522 may begin with a non-vertical, upward stroke 525 from the start point 523; followed by a rounded transition stroke 526; followed by a downward stroke 527 to the end point 524. The rounded transition stroke 526 is rounded away from the upward stroke 525 and the downward stroke 527. Thus, the three strokes form an arc shape. Preferably, the downward stroke 527 is at an angle to the upward stroke 525 of between about ten degrees and about one-hundred seventy degrees. More preferably, the downward stroke 527 is at an angle to the upward stroke 525 of between about twenty degrees and about one-hundred twenty degrees. Even more preferably, the downward stroke 527 is at an angle to the upward stroke 525 of between about thirty degrees and about eighty degrees. Thus, in embodiments, the downward stroke 527 is non-vertical. Even so, the downward stroke 527 could be at any angle to the upward stroke 525.

In embodiments, the start point 523 and the end point 524 are substantially at a common vertical level on the touchscreen display, such as shown in FIGS. 5A and 5B. In embodiments, the downward stroke 527 may be a certain fraction or multiple of the upward stroke 525. Thus, the downward stroke 527 may be shorter or longer than the upward stroke 525. For example, if the upward stroke 525 has a length "h," then the downward stroke 527 may have a length of 0.2 h, 0.5 h, 0.7 h, h, 1.2 h, and 1.5 h, to name a few examples. Other values are also possible. Thus, the start point 523 and the end point 524 need not be at a common vertical level in all versions.

Figure 6:
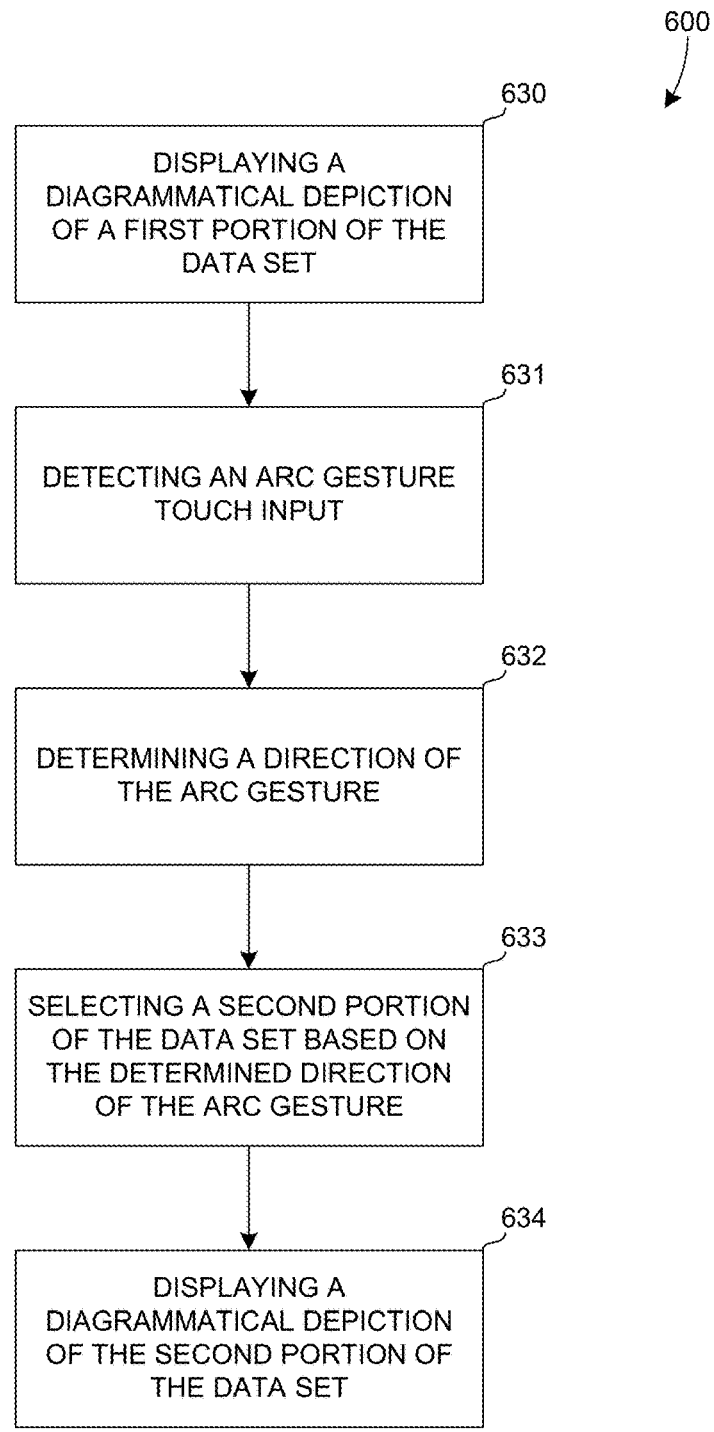
FIG. 6 is a flowchart of a method of navigating between portions of a data set.

Thus, such as shown in FIG. 6, a method embodiment 600 of navigating between portions of a data set may include displaying a diagrammatical depiction of a first portion of the data set 630 on a touchscreen display, detecting an arc-gesture touch-input 631 at the touchscreen display, determining a direction of the arc gesture 632, selecting a second portion of the data set based on the determined direction of the arc gesture 633, and displaying a diagrammatical depiction of the second portion of the data set 634 a touchscreen display.

In embodiments, the touchscreen display is any touchscreen that supports gestures. The first portion of the data set and the second portion of the data set are each less than a whole of the data set. In embodiments, the second portion does not overlap the first portion. With further reference to FIG. 3 as an example, the whole data set, or the entire buffer, is depicted as the measurement burst of Group #1, plus the measurement burst of Group #2, plus the measurement burst of Group #3, and plus the idle time sections between those groups. The first portion of the data set may be, for example, Group #2, and the second portion of the data set may be, for example, Group #3. In other embodiments, the first portion of the data set may be, for example, the right half of Group #3, and the second portion of the data set may be, for example, the right half of Group #2.

In embodiments, determining the direction of the arc gesture includes detecting whether the end point 524 is to a first side 528 or to a second side 529 of the start point 523. For example, the end point 524 may be to a left side of the start point 523, such as shown in FIG. 5A. As another example, the end point 524 may be to a right side of the start point 523, such as shown in FIG. 5B. In some embodiments, when the determined direction of the arc gesture is to the right side, the selected second portion of the data set has a group marker that is after a group marker of the first portion of the data set. In such embodiments, the display hops forward from the first portion to the second portion of the data set. In other embodiments, when the determined direction of the arc gesture is to the left side, the selected second portion of the data set has a group marker that is before a group marker of the first portion of the data set. In such embodiments, the display hops backward from the first portion to the second portion of the data set.

In some embodiments, the diagrammatical depiction of the first portion is offset from the group marker of the first group by a shifted amount, and the diagrammatical depiction of the second portion is offset from the group marker of the second group by the shifted amount. For example, suppose the x-axis indicates time and the diagrammatical depiction of the first portion is offset from the group marker of the first group by 20 milliseconds. Accordingly, the diagrammatical depiction of the second portion may be offset from the group marker of the second group by 20 milliseconds. Thus, there is the same relative offset within the second group as was present before the start of the arc gesture from within the first group. "Offset" may mean that the left edge of the depicted view is offset from the group marker. In embodiments that are not offset and that have a start of group marker, the start of group marker is typically at the left edge of the depicted view as indicated, for example, in FIG. 1B. In some embodiments, the diagrammatical depiction of the second portion retains the same zoom amount as the diagrammatical depiction of the first portion. For example, if the diagrammatical depiction of the first portion is shown at 200% zoom before the hop to the diagrammatical depiction of the second portion, then the diagrammatical depiction of the second portion is also shown at 200% zoom. The diagrammatical depiction of the second portion also might retain both the offset and the zoom amount of the diagrammatical depiction of the first portion.

One advantage of the arc gesture is that it does not interfere with conventional panning and zooming. That is, conventional zooming is typically implemented with a pinch-to-zoom gesture, which is a two-finger operation. By contrast, the arc gesture involves one finger or one stylus and therefore is generally not ambiguous with zooming. For panning, which is normally done by sliding the finger on the display in the panning direction, the quickest path between two points is a line. Accordingly, if the user wants to pan from one spot to another, panning normal involves a finger slide in a straight line. Because of this, the arc gesture can be used without being ambiguous with respect to the pan gesture.

In some situations, though, the beginning of the arc gesture may be ambiguous with respect to the pan gesture. For example, as the first, upward stroke is made by the finger or stylus, the processor cannot tell if it is a conventional pan or the beginning of the arc gesture. Accordingly, in embodiments, the processor may assume that the gesture is a panning gesture and begin to pan the image. Then, once the arc gesture is distinguished from the pan gesture, the processor may show a visual indicator that the arc gesture was detected. The distinction may occur, for example, during the downward stroke. If the user releases their finger or stylus after completing the arc pattern, the processor will allow the view will hop to the next group or the previous group, depending on the direction of the arc gesture. If the user breaks the arc pattern, such as by lifting the finger or stylus before the arc gesture is complete, then the processor will allow the image to pan instead of hop. Since there are more efficient and natural ways to pan without creating arcs, this is not problematic for the typical user. In some embodiments, the pan will continue, even after the arc gesture is detected or distinguished, until the user lifts the finger or stylus once the arc gesture is completed, at which point the view will hop forward or backward, depending on the direction of the arc gesture.

On the other hand, if the processor detects an arc gesture, but the user intended to pan, the user may retrace the arc gesture until the arc gesture screen indicator disappears. For example, the user may slide the user's finger back up the downward stroke and return to panning. In this way, the processor may cancel the arc gesture and, thus, the hopping function.

Figure 7:
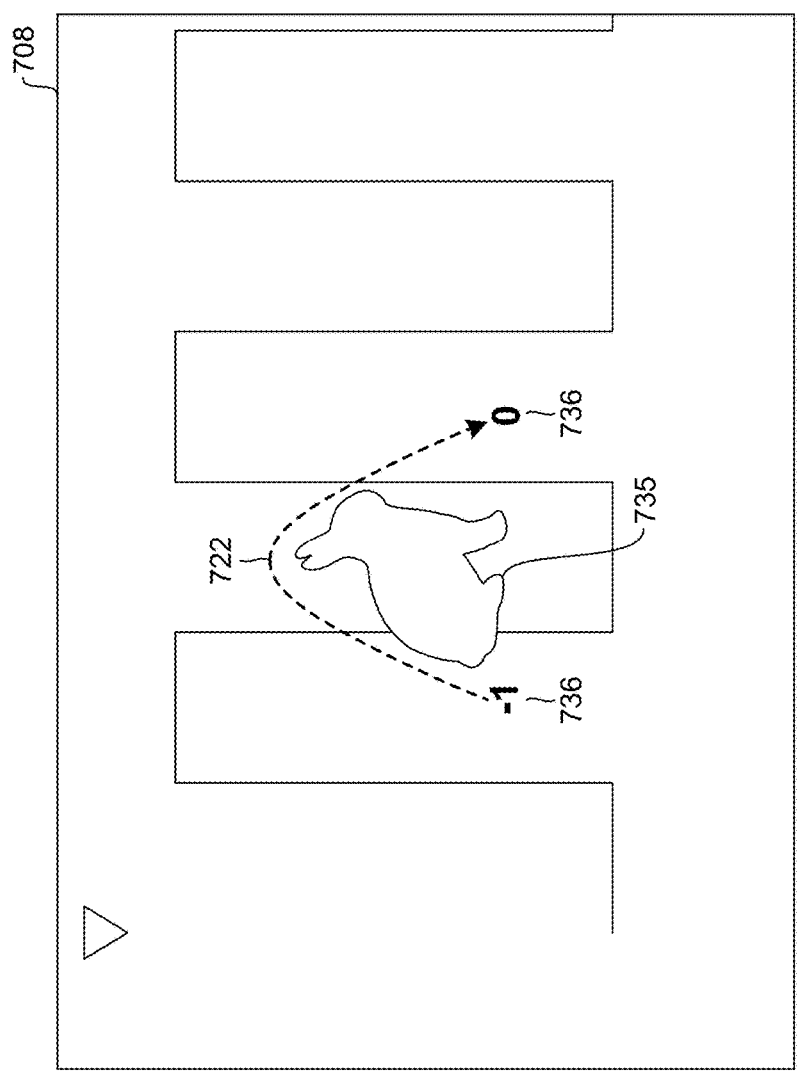
FIG. 7 is a visual representation of the method of FIG. 6.

The image in FIG. 7 shows conceptually what a touchscreen display 708 may look like when an arc gesture 722 is detected. In embodiments, the visual indicator 735 that the arc gesture 722 was detected is a graphical depiction of a rabbit. The numbers 736 could be used to indicate which groups the user is jumping between. For example, as shown in FIG. 6, the numbers 736 indicate that the user is jumping from group "−1" to group "0." In embodiments, group "0" is the most recent group, and group "−1" is the second most recent group.

These examples show that the arc gesture can be implemented in an unambiguous way that still allows support for panning and pinch-to-zoom without creating confusion.

Figure 8:
FIG. 8 is a photograph of a front panel of an electronic device.

FIG. 8 is a photograph of a front panel of an electronic device 837, according to embodiments. As noted above, the electronic device 837 may be a digital multimeter, such as depicted in FIG. 8. The electronic device 837 may include a touchscreen display 808 and one or more input ports 838.

Figure 9:
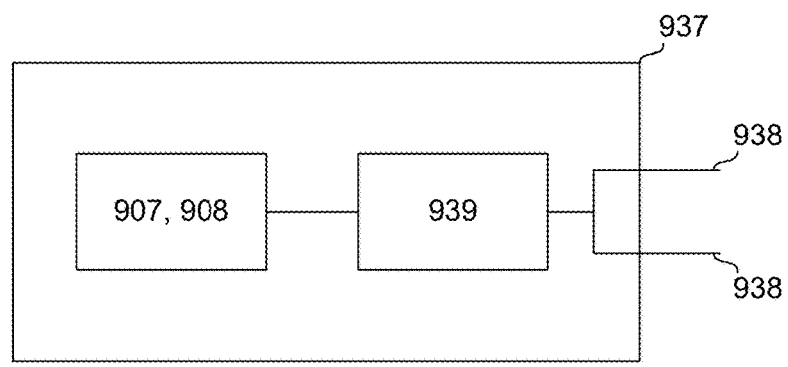
FIG. 9 is a functional block diagram of an embodiment of an electronic device.

FIG. 9 is a functional block diagram of an embodiment of an electronic device 937, such as the digital multimeter depicted in FIG. 8. The electronic device 937 may include a graphical display 907, which could be a touchscreen display 908. The electronic device 937 may also include one or more input ports 938 to introduce test and measurement data into the electronic device 937. The input ports 938 could be electronic probes, for example. The electronic device 937 may also include a processor 939 that is in communication with the graphical display 907. In some embodiments, the processor 939 is external to the electronic device 937. While FIG. 9 shows the same processor 939 being connected to the graphical display 907 and the input ports 938, the processor 939 can be more than one processor in some embodiments.

In some embodiments, some or all of the above-described operations and methods are implemented with a non-transitory computer-readable medium having computer-executable instructions stored on it. When the instructions are executed by a computing device, they cause the computing device to perform some or all of the above-described operations and methods. In embodiments, the computer-readable medium is part of a digital multimeter. The computer-readable medium can be part of an oscilloscope, and the computer-readable medium can be part of a processor connected to an electronic device having a graphical display.

The previously described versions of the disclosed subject matter have many advantages that were either described or would be apparent to a person of ordinary skill. Even so, all of these advantages or features are not required in all versions of the disclosed apparatus and methods.

Additionally, this written description makes reference to particular features and operations. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method comprising two or more defined steps or operations, the defined steps or operations can be carried out in any order or simultaneously, unless the context excludes those possibilities.

Although specific embodiments of the invention have been illustrated and described for purposes if illustration, it will be understood that various modifications may be made without departing from the spirit and scope of the invention. Accordingly, the invention should not be limited except as by the appended claims.

What is claimed is:

1. In an electronic test and measurement instrument having a graphical display, a method comprising:
   determining, with a processor, a quantity of group markers in a data set; and
   determining, with the processor and based on the quantity of group markers, a suggested view from a plurality of available views, each view in the plurality of available views diagrammatically depicting at least a portion of the data set, in which
   when the quantity of group markers is zero, the suggested view is a diagrammatical depiction of a latest portion of the data set;
   when the quantity of group markers is greater than one, the suggested view is a diagrammatical depiction of a most-recent full-burst portion of the data set; and
   when the quantity of group markers is equal to one, the suggested view is a diagrammatical depiction of an entirety of the data set; the method further comprising
   before determining the suggested view, receiving at the processor a user-initiated signal to request the suggested view; and
   displaying the suggested view on a touchscreen display, in which the user-initiated signal results from a user selecting an icon on the touchscreen display.

2. The method of claim 1, in which the suggested view comprises a diagrammatical depiction of a subset of the data set arranged on a horizontal x-axis and a vertical y-axis, the method further comprising:
   determining a maximum y-value and a minimum y-value of the subset; and
   adjusting a y-axis scale such that the maximum y-value is substantially at an upper limit of the y-axis and the minimum y-value is substantially at a lower limit of the y-axis.

3. The method of claim 1, further comprising setting a group marker before determining the quantity of group markers.

4. The method of claim 3, in which setting the group marker comprises setting the group marker at a first measurement point of a sequence of measurements, if a total quantity of measurements in the sequence is finite and is greater than one.

5. The method of claim 4, in which setting the group marker comprises setting the group marker at the first measurement point in real time, as the first measurement point is recorded.

6. A processor-implemented graphical method of navigating between portions of a data set on a touchscreen display, the method comprising:
   displaying, on the touchscreen display, a diagrammatical depiction of a first portion of the data set, the first portion being less than a whole of the data set;
   detecting a touch input at the touchscreen display, the touch input comprising a continuous arc gesture with a start point and an end point;
   determining a direction of the arc gesture by detecting whether the end point is to a first side or to a second side of the start point;
   selecting a second portion of the data set based on the determined direction of the arc gesture, the second portion being less than the whole of the data set, the second portion not overlapping the first portion; and
   displaying, on the touchscreen display, a diagrammatical depiction of the second portion of the data set.

7. The method of claim 6, in which the arc gesture comprises:
   a non-vertical, upward stroke from the start point;
   followed by a rounded transition stroke;
   followed by a downward stroke to the endpoint,
   in which the rounded transition stroke is rounded away from the upward stroke and the downward stroke.

8. The method of claim 6, in which the first side is a right side of the start point from a point of view of a user and the second side is a left side of the start point from the point of view of the user; and
   when the determined direction of the arc gesture is to the right side, the selected second portion of the data set has a group marker that is after a group marker of the first portion of the data set, and
   when the determined direction of the arc gesture is to the left side, the selected second portion of the data set has a group marker that is before a group marker of the first portion of the data set.

9. The method of claim 8, in which:
   the diagrammatical depiction of the first portion is offset from the group marker of the first group by a shifted amount, and
   the diagrammatical depiction of the second portion is offset from the group marker of the second group by the shifted amount.

10. A non-transitory computer-readable medium having computer-executable instructions stored thereon that, in response to execution by a computing device, cause the computing device to perform operations, the operations comprising:
    determining a quantity of group markers in a data set; and
    determining, based on the quantity of group markers, a suggested view from a plurality of available views, each view in the plurality of available views diagrammatically depicting at least a portion of the data set, in which
    when the quantity of group markers is zero, the suggested view is a diagrammatical depiction of a latest portion of the data set;
    when the quantity of group markers is greater than one, the suggested view is a diagrammatical depiction of a most-recent full-burst portion of the data set; and
    when the quantity of group markers is equal to one, the suggested view is a diagrammatical depiction of an entirety of the data set; the operations further comprising
    before determining the suggested view, receiving at the computing device a user-initiated signal to request the suggested view; and
    displaying the suggested view on a display device, in which the user-initiated signal results from a user selecting an icon on the display device.

11. The computer-readable medium of claim 10, in which the determined quantity of group markers is greater than one and in which the display device comprises a touchscreen display, the operations further comprising:
- displaying, on the touchscreen display, a diagrammatical depiction of a first portion of the data set, the first portion being less than a whole of the data set;
- detecting a continuous arc gesture, with a start point and an end point, input at the touchscreen display;
- determining a direction of the arc gesture by detecting whether the end point is to a first side or to a second side of the start point;
- selecting a second portion of the data set based on the determined direction of the arc gesture, the second portion being less than the whole of the data set; and
- displaying, on the touchscreen display, a diagrammatical depiction of the second portion of the data set.

12. The computer-readable medium of claim 11, in which the first side is a right side of the start point from a point of view of a user and the second side is a left side of the start point from the point of view of the user; and
- when the determined direction of the arc gesture is to the right side, the selected second portion of the data set has a group marker that is after a group marker of the first portion of the data set, and
- when the determined direction of the arc gesture is to the left side, the selected second portion of the data set has a group marker that is before a group marker of the first portion of the data set.

\* \* \* \* \*